(12) United States Patent  
Pilo et al.

(10) Patent No.: US 6,998,897 B2  
(45) Date of Patent: *Feb. 14, 2006

(54) SYSTEM AND METHOD FOR IMPLEMENTING A MICRO-STEPPING DELAY CHAIN FOR A DELAY LOCKED LOOP

(75) Inventors: Harold Pilo, Underhill, VT (US); Reid A. Wistort, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/708,311

(22) Filed: Feb. 24, 2004

(65) Prior Publication Data

US 2005/0184776 A1    Aug. 25, 2005

Related U.S. Application Data

(62) Division of application No. 10/708,287, filed on Feb. 23, 2004.

(51) Int. Cl.  
*H03H 11/26* (2006.01)

(52) U.S. Cl. ..................................... 327/276
(58) Field of Classification Search ................ 327/153, 327/161, 261, 263, 276–278, 284–285, 299  
See application file for complete search history.

(56) References Cited

U.S. PATENT DOCUMENTS

| | | | |
|---|---|---|---|
| 5,223,755 A | 6/1993 | Richley | 307/603 |
| 5,287,025 A | 2/1994 | Nishimichi | 307/603 |
| 5,422,835 A | 6/1995 | Houle et al. | 364/703 |
| 5,604,775 A | 2/1997 | Saitoh et al. | 375/376 |
| 5,854,615 A | 12/1998 | Hush | 345/99 |
| 6,031,429 A | 2/2000 | Shen | 331/17 |
| 6,100,735 A | 8/2000 | Lu | 327/158 |
| 6,101,197 A | 8/2000 | Keeth et al. | 370/517 |
| 6,125,157 A | 9/2000 | Donnelly et al. | 375/371 |
| 6,255,880 B1 | 7/2001 | Nguyen | 327/277 |
| 6,316,976 B1 | 11/2001 | Miller, Jr. et al. | 327/156 |
| 2003/0001650 A1 * | 1/2003 | Cao et al. | 327/277 |

* cited by examiner

*Primary Examiner*—My-Trang Nu Ton  
(74) *Attorney, Agent, or Firm*—Michael LeStrange; Cantor Colburn LLP

(57) ABSTRACT

A delay locked loop for use in an integrated circuit device includes a coarse delay chain in series with a micro-stepped delay chain. The coarse delay chain includes a plurality of coarse delay units configured for selectively providing a coarse delay with respect to an input clock signal, and the micro-stepped delay chain is configured for selectively providing a fine delay adjustment with respect to the input clock signal. The micro-stepped delay chain further includes a plurality of parallel signal paths, wherein one or more of the parallel signal paths are capacitively loaded so as to provide the fine delay adjustment.

19 Claims, 6 Drawing Sheets

SYSTEM AND METHOD FOR IMPLEMENTING A MICRO-STEPPING DELAY CHAIN FOR A DELAY LOCKED LOOP

CROSS-REFERENCE TO RELATED APPLICATIONS

This application is a divisional of U.S. patent application Ser. No. 10/708,287, filed Feb. 23, 2004, the contents of which are incorporated by reference herein in their entirety.

BACKGROUND OF INVENTION

The present invention relates generally to integrated circuit devices and, more particularly, to a system and method for implementing a micro-stepping delay chain for a digital delay locked loop (DLL).

In synchronous electronic systems, the integrated circuits in the system are synchronized to a common reference clock. This synchronization often cannot be achieved simply by distributing a single reference clock to each of the integrated circuits for the following reason, among others. When an integrated circuit receives a reference clock, the circuit often must condition the reference clock before the circuit can use the clock. For example, the circuit may buffer the incoming reference clock or may convert the incoming clock from one voltage level to another. This processing introduces its own delay, with the result that the processed reference clock, which will be referred to as a local clock, often will no longer be adequately synchronized with the incoming reference clock. The trend towards faster system clock speeds further aggravates this problem since faster clock speeds reduce the amount of delay, or clock skew, which can be tolerated.

To remedy this problem, an additional circuit is typically used to synchronize the local clock to the reference clock. Two common circuits that are used for this purpose are the phase-locked loop (PLL) and the delay-locked loop (DLL). In the phase-locked loop, a voltage-controlled oscillator produces the local clock. The phases of the local clock and the reference clock are compared by a phase-frequency detector, with the resulting error signal used to drive the voltage-controlled oscillator via a loop filter. The feedback via the loop filter phase locks the local clock to the reference clock. Stability of the feedback loop, however, depends in part on the loop filter. The electronic characteristics of the loop filter, in turn, often depend significantly on manufacturing parameters. As a result, the same loop filter design may result in a stable feedback loop when manufactured with one process but an unstable loop when manufactured by another. It is difficult to produce a single loop filter design for use with all manufacturing processes, and the design of the loop filter typically must be optimized on a process-by-process basis.

In contrast, the delay-locked loop generates a synchronized local clock by delaying the incoming reference clock by an integer number of clock periods. More specifically, the buffers, voltage level converters, etc., of the integrated circuit introduce a certain amount of delay. The DLL introduces an additional amount of delay such that the resulting local clock is synchronous with the incoming reference clock. This approach avoids the stability problem inherent in the phase-locked loop approach. Delay-locked loops, however, have a disadvantage of narrow dynamic range relative to their precision. That is, a highly accurate DLL requires that the two clock signals being synchronized have a phase difference that is relatively small. On the other hand, conventional DLLs can be made to synchronize clocks with a larger phase difference, but the resulting accuracy decreases and may be less than desirable.

Accordingly, there is a need for an improved DLL device which synchronizes local clocks to reference clocks, and which provides a wider dynamic range of operation with acceptable precision.

SUMMARY OF INVENTION

The foregoing discussed drawbacks and deficiencies of the prior art are overcome or alleviated by a delay locked loop for use in an integrated circuit device. In an exemplary embodiment, the delay locked loop includes a coarse delay chain in series with a micro-stepped delay chain. The coarse delay chain includes a plurality of coarse delay units configured for selectively providing a coarse delay with respect to an input clock signal, and the micro-stepped delay chain is configured for selectively providing a fine delay adjustment with respect to the input clock signal. The micro-stepped delay chain further includes a plurality of parallel signal paths, wherein one or more of the parallel signal paths are capacitively loaded so as to provide the fine delay adjustment.

In another embodiment, a micro-stepped delay chain for use in a delay locked loop includes a plurality of parallel signal paths coupled to a common input. A first of the plurality of parallel signal paths includes a single coarse delay unit, and a second of the plurality of parallel signal paths includes a pair of coarse delay units. The remainder of the plurality of parallel signal paths each includes a single coarse delay unit having an intermediate node thereof loaded with a stepped value of capacitance with respect to one another. A signal propagated through any of the remainder of the plurality of parallel signal paths has a delay associated therewith that represents a stepped valued of delay between the delay provided by the single coarse delay unit and the delay provided by the pair of coarse delay units.

In still another embodiment, a method for implementing delay locked loop in an integrated circuit device includes configuring a coarse delay chain in series with a micro-stepped delay chain. The coarse delay chain includes a plurality of coarse delay units the micro-stepped delay chain is configured for selectively providing a fine delay adjustment with respect to the input clock signal. A plurality of parallel signal paths is configured within the micro-stepped delay chain, wherein one or more of the parallel signal paths are capacitively loaded so as to provide the fine delay adjustment.

BRIEF DESCRIPTION OF DRAWINGS

Referring to the exemplary drawings wherein like elements are numbered alike in the several Figures.

DETAILED DESCRIPTION

Disclosed herein is a system and method for implementing a micro-stepping delay chain for a digital delay locked loop (DLL). Briefly stated, a micro-stepped coarse delay unit is used in series with a coarsely stepped delay chain, thereby achieving fine increments in a DLL delay chain. The embodiments described hereinafter allow for monotonicity (i.e., linearity) in the challenging, 10 picosecond (ps) range.

Many existing DLL designs use analog techniques, which may be difficult to implement, and tough to scale between technology generations. Fully digital DLL's are also available that include a delay chain having of a series of inverter pairs that serve as coarse delay units. A conventional way of fine-tuning a coarse delay unit is illustrated in the circuit 100 shown in FIG. 1. As is shown, an inverter stage 102 between an input pin (IN) and an output pin (OUT) includes a PFET P0 and an NFET N0 having the gate terminals thereto coupled to the input pin IN. A base value pull up device P1 and a base value pull down device N1 are biased to a conducting state by having the gate terminals thereof connected to ground and $V_{DD}$, respectively.

In addition to the base pull up and pull down devices, there are also a series of additional pull up devices TP0–TP3 and pull down devices TN0–TN3 that are selectively energized by a 4-bit control signal for changing the pull up/pull down strength of the inverter stage 102. This in turn decreases the delay of a signal propagated from the input pin IN to the output pin OUT. A lumped capacitor C0 is also chosen for the desired slew rate of the signal transition in the inverter stage 102. The higher the value of the 4-bit, binary input (COUNT 0–COUNT 3), the stronger the value of the driving stacks, therefore resulting in a faster slew rate and a shorter delay through the coarse delay unit. It will be understood that the DLL device of FIG. 1 could also be operated with a greater or lesser number of pull up/pull down devices.

Figure 1:
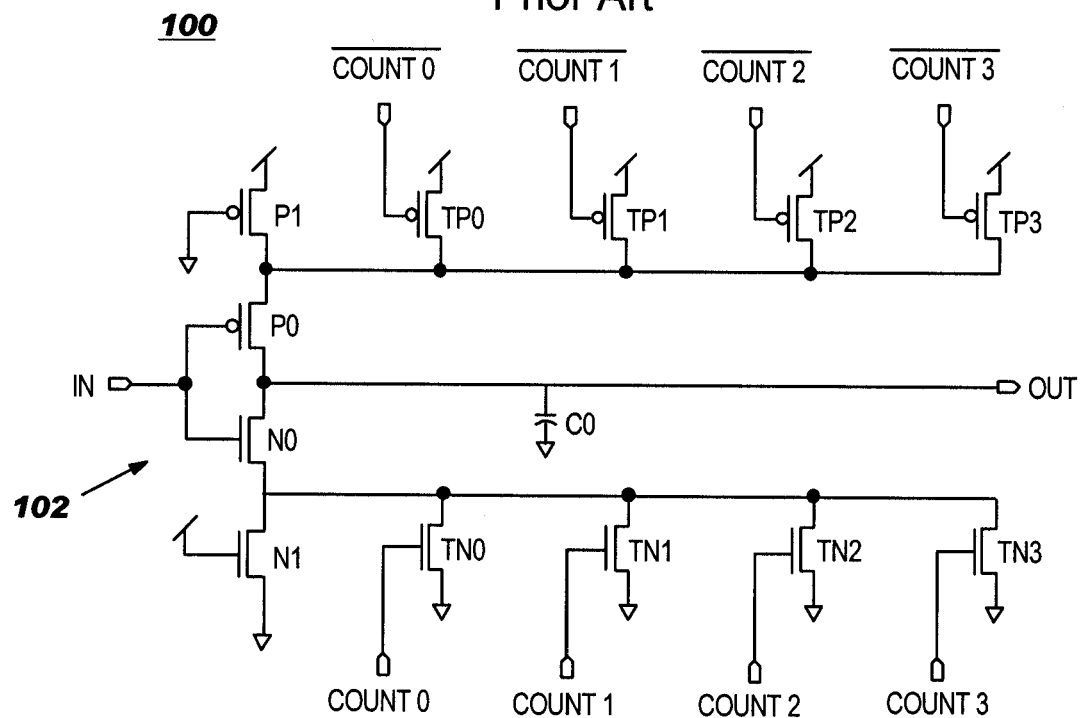
FIG. 1 is a schematic diagram of an existing circuit for fine-tuning a coarse delay device.
Figure 2:
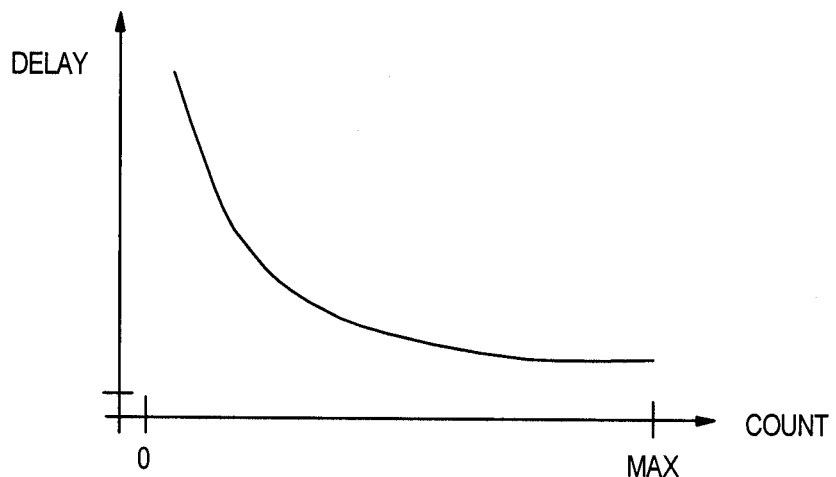
FIG. 2 is a graph of the nonlinear delay response versus the value of the step count input signal for the circuit of FIG. 1.

However, one problem associated with the fully digital DLL approach shown in FIG. 1 is that the actual delay response versus the value of the binary COUNT input signal can be very nonlinear, as illustrated in FIG. 2. As can be seen, when the binary value of COUNT is large, a Least Significant Bit (LSB) change in COUNT results in a vanishingly small change (decrease) in the delay of the delay element. Moreover, when the value of COUNT is small, an LSB change results in a relatively large change (decrease) in the delay of the delay element (e.g., on the order of several hundred picoseconds). Attempts to linearize the incremental delay following an LSB change in the control signal tend to come at the expense of the overall range the delay element can achieve. In the example illustrated, the range of the delay element is equal to the delay at COUNT=0000, minus the delay at COUNT=1111. One possible way to linearize a DLL's delay is to build a delay chain wherein sheer number of stages is proportional to a digital COUNT. However, using this approach, an LSB-worth of change in delay tends to be on the order of about 100 ps. This is a higher value than desired, and would result in observable jitter on the digital delay. In addition, it is difficult to implement a scheme that multiplexes gates into and out of the delay chain without also affecting the monotonicity and linearity of the delay vs. COUNT curve.

Figure 3:
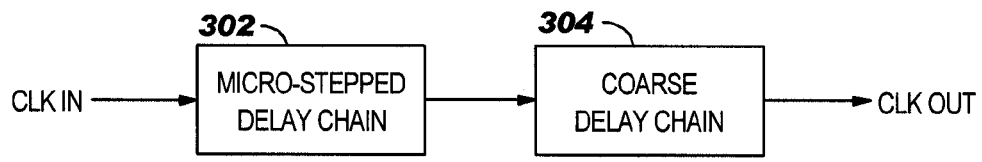
FIG. 3 is a schematic block diagram of a delay chain for a digital delay locked loop (DLL) wherein a micro-stepped delay chain is configured in series with a coarse delay chain, in accordance with an embodiment of the invention.

Therefore, in accordance with an embodiment of the invention, FIG. 3 illustrates a schematic block diagram of a delay chain 300 for a digital delay locked loop (DLL), in which a micro-stepped delay chain 302 is configured in series with a coarse delay chain 304. As described in further detail hereinafter, the micro-stepped delay chain 302 utilizes selective capacitive loading of the intermediate node of a two-NAND gate inverter pair to achieve finer increments of delay between a single inverter pair and a double inverter pair. Moreover, each stage within the course delay chain 304 utilizes NAND gates for both delay functioning and multiplexing functioning, such that signal propagation through an internal multiplexer also functions as part of the delay within the overall coarse delay chain.

Figure 4:
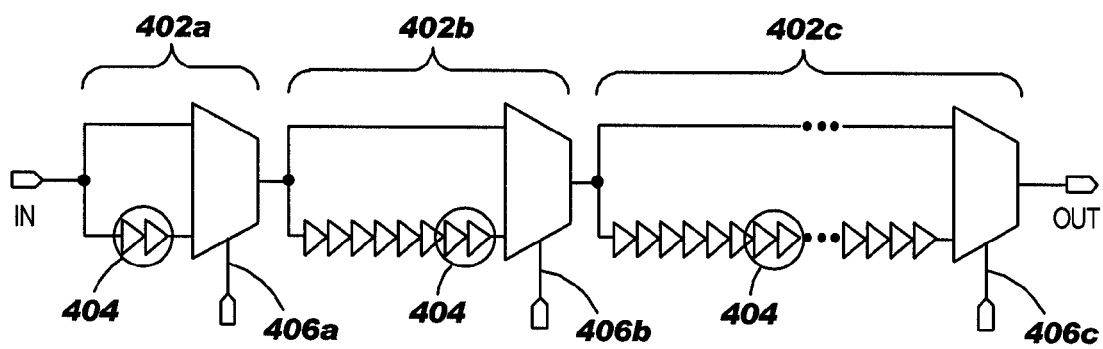
FIG. 4 is a schematic diagram illustrating a conceptual representation of a linear delay chain included within the coarse delay chain of FIG. 3.

Referring now to FIG. 4, there is illustrated a schematic diagram illustrating a conceptual representation of a linear delay chain included within the coarse delay chain 304 of FIG. 3. A plurality of serially connected coarse delay stages 402a, 402b, 402c include one or more coarse delay units 404 (schematically represented by a double inverter symbol). In particular, the conceptual representation of FIG. 4 depicts stage 402a as including delays comprising single coarse delay units, stage 402b including delays comprising four coarse delay units therein, and stage 402c including delays comprising sixteen coarse delay units therein.

In one particular embodiment, stage 402a is configured to provide three discrete levels of delay: a two-gate delay (equal to one coarse delay unit), a four-gate delay (equal to two coarse delay units) and a six-gate delay (equal to three coarse delay units). Furthermore, each of the coarse delay unit 404 may be selectively passed (i.e., providing a zero-gate delay, or no delay). Thus, the control signal 406a reflects that stage 402a can provide some delay (a gate delay of 2, 4 or 6 gates) or no delay at all. In stage 402b, the delays are combined from four coarse delay units 404 each to effectively provide three larger discrete levels of gate delay, equaling 0, 8, 16, or 24 gates, as represented by control signal 406b. Consequently, in stage 402c, the combined sixteen coarse delay units provide discrete levels of gate delay, corresponding to 0, 32, 64 or 96 gates, as represented by control signal 406c.

Figure 5:
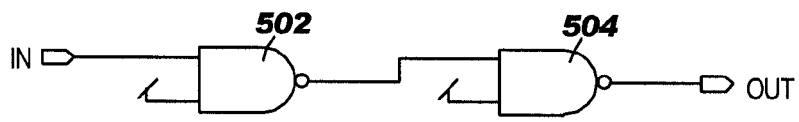
FIG. 5 is a schematic diagram of an exemplary implementation of a coarse delay unit used in the coarse delay chain.
Figure 6:
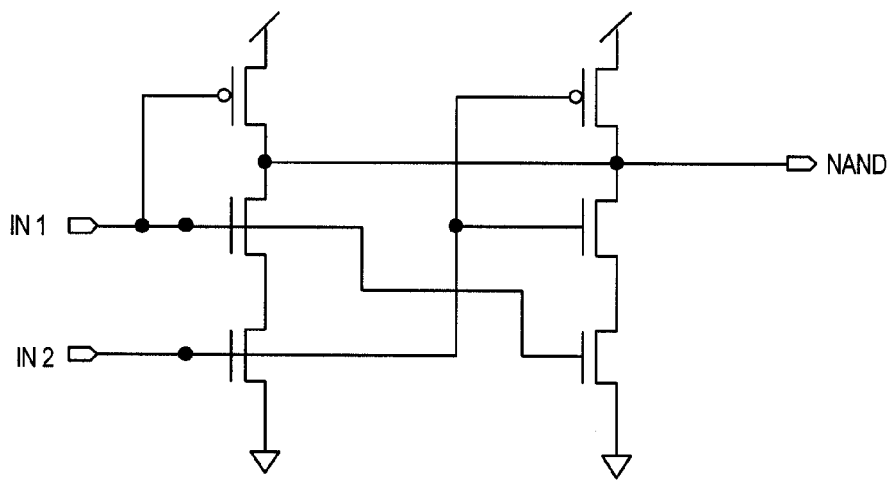
FIG. 6 is a schematic diagram of an equalized NAND gate used in the implementation of the coarse delay unit shown in FIG. 5.

FIG. 5 illustrates an exemplary implementation of a coarse delay unit 404 used to create the delay. The course delay unit 404 includes a pair of coupled NAND gates 502, 504 with one input terminal of each gate coupled to a logic high voltage. Thus, to carry out a 6-gate coarse delay offered by first stage 402a, for example, an input signal is passed through three consecutive coarse delay units 404 (i.e., through 3 NAND gate pairs). In order for the propagation delay through a coarse delay unit 404 to be independent of which of the two NAND gate input pins the signal is applied to, an equalized NAND gate implementation is used. An example of such an equalized NAND gate is shown in FIG. 6.

Figure 7:
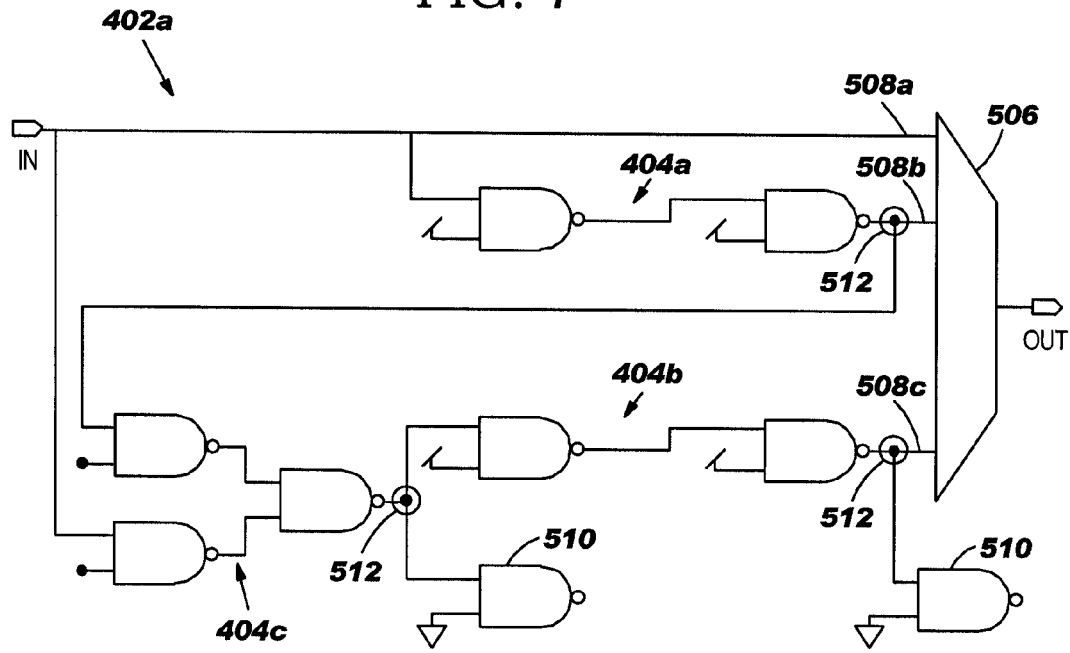
FIG. 7 is a schematic diagram of an implementation of the discrete levels of gate delay available within the coarse delay chain.

As stated above, each stage 402a, 402b, 402c of the coarse delay chain 304 is capable of providing a zero delay, as well as three discrete levels of gate delay through a multiplexing function. FIG. 7 is a schematic diagram of an implementation of the discrete levels of gate delay, including the multiplexing function. One advantageous feature of the implementation of FIG. 7 is that some of the NAND gates themselves provide both a delay function and a multiplexing function. In the example depicted in FIG. 7, the delay circuitry provided in stage 402a is illustrated. For ease of illustration, the static routing logic is not shown in FIG. 7.

More specifically, stage 402a includes a first coarse delay unit 404a (i.e., a NAND gate pair), and a second coarse delay unit 404b, similar to the schematic of FIG. 5. In addition, a third coarse delay unit 404c includes three NAND gates as shown in FIG. 7 so as to provide an alternative signal routing path that carries out both a multiplexing function and a delay function. As such, there are three input paths to multiplexer 506 instead of four. Thus configured, the application of appropriate routing logic to the inputs of the multiplexer 506, as well as to the two input NAND gates of coarse delay unit 404c, will effectively determine which of four possible delay options (0 gates, 2 gates, 4 gates or 6 gates) will be taken. In this manner, a portion of the overall multiplexing function is carried out by multiplexer 506, while the remaining portion is carried out by coarse delay unit 404c.

As can be seen, a selected 0-gate delay will result in a signal propagating directly from the input pin (IN) directly to the topmost input terminal 508a of multiplexer 506. A selected 2-gate delay will result in the signal propagating from input pin (IN), through first coarse delay unit 404a, and to the middle input terminal 508b of multiplexer 506. A selected 4-gate delay will result in the signal propagating from input pin (IN), directly through third coarse delay unit 404c (via the lower of the two input NAND gates), through second coarse delay unit 404b, and to the bottom input terminal 508c of multiplexer 506. Finally, a selected 6-gate delay will result in the signal propagating from input pin (IN), through first coarse delay unit 404a, through third coarse delay unit 404c (via the upper of the two input NAND gates), through second coarse delay unit 404b, and to the bottom input terminal 508c of multiplexer 506.

Because the output of first coarse delay unit 404a has a signal fan-out of two, dummy NAND gates 510 are also coupled to the outputs of second coarse delay unit 404b and third coarse delay unit 404c so as to provide consistency in the delay through each of the coarse delay units. This is highlighted in FIG. 7 by the circled nodes 512.

It will further be appreciated that the discrete gate delays provided by the circuit of FIG. 7 (0, 2, 4, 6) may be converted to the larger scaling of the second stage 402b (0, 8, 16, 24) and third stage 402c (0, 32, 64, 96) by simply adding an appropriate number of additional NAND gate pairs/coarse delay units in a given delay path. Thus, to create a discrete 8-gate delay path, for example, four NAND gate pairs would be used in lieu of the single NAND gate pair of the first coarse delay unit 404a. Altogether, then, there are a total of (6+24+96=126) gate delay paths that are selectable within the coarse delay chain 304. Since each coarse delay unit includes two gates therein, then there are 126/2=63 coarse steps of delay possible from the coarse delay chain 304, in addition to a zero delay.

Referring once again to FIG. 5, the NAND gate pair of the coarse delay unit 404 shown therein represents the minimum unit of delay available from the coarse delay chain 304. However, the propagation delay therethrough may be on the order of about 60 ps, for example, which may be too large (coarse) for the desired granularity of the overall delay through the delay chain 300 of FIG. 3. Therefore, in accordance with still a further aspect of the invention, FIG. 8 is a schematic diagram illustrating the "micro-stepping" function of the micro-stepped delay chain 302 used to generate intermediate values of delay between one coarse delay unit (e.g., 60 ps) and two coarse delay units (e.g., 120 ps).

Figure 8:
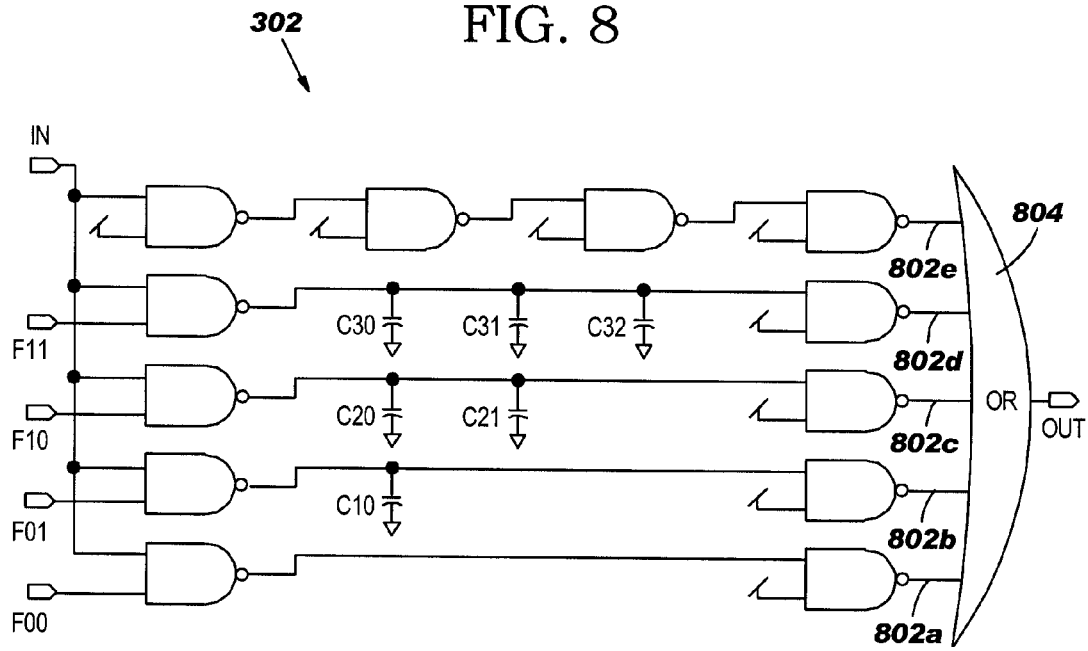
FIG. 8 is a schematic diagram illustrating the micro-stepping function of the micro-stepped delay chain used to generate intermediate values of delay between one coarse delay unit and two coarse delay units.

As is shown in FIG. 8, the micro-stepped delay chain 302 includes a plurality of parallel signal paths 802a, 802b, 802c, 802d, and 802e, which are each coupled to a five-input OR gate 804. The bottom path 802a includes only the two NAND gates as used in a single coarse delay unit. The top path 802e includes four NAND gates (i.e., two coarse delay units), the purpose of which will be described hereinafter. The middle three paths 802b, 802c and 802d are each configured from a single coarse delay unit, but have the intermediate nodes thereof increasingly loaded with levels of capacitance that are designed to increase the propagation time with respect to an unloaded single coarse delay unit by changing the slew rate of the propagated signal.

In the example illustrated, signal path 802b has the intermediate node thereof loaded with a single unit of capacitance, designated as C10. This capacitance could be implemented, for example, by connecting the intermediate node to both inputs of a dummy NAND gate. In the case of signal path 802c, two capacitances C20, C21 are coupled to the intermediate node thereof, thereby further increasing the incremental delay. Likewise, signal path 802d has three capacitances C30, C31, C32 coupled to the intermediate node thereof.

Regardless of the manner in which the capacitances are implemented, the three intermediate signal paths are preferably configured such that a signal propagated therethrough is delayed by a fractional amount with respect to the total propagation time through the capacitance free path 802a. For example, if the propagation time through unloaded signal path 802a is assigned a base value of 1.0, then the propagation time through single-loaded signal path 802b may have a value of 1.25. Accordingly, the propagation time through double-loaded signal path 802c may have a value of 1.5, and the propagation time through triple-loaded signal path 802d may have a value of 1.75.

The particular path through which an input signal will propagate is dependent upon the value of the control signal applied to input terminals F00, F01, F10 and F11. The control logic is configured such that only one of the four paths 802a, 802b, 802c and 802d are activated at any one time. As such, if the propagation delay through the minimum coarse delay unit is 60 ps, this is the minimum increment by which the coarse delay chain could otherwise be adjusted. However, using the micro-stepped delay chain 302 of FIG. 8, this resolution can be refined to 0.25*60 ps=15 ps, in the example illustrated.

In the event that the calibration of the capacitances is not "in agreement" with the propagation time through a single coarse delay unit, the fifth signal path 802e is used to provide a "worst-case" two coarse delay unit path (i.e., a base value of 2.0). Since signal path 802e is biased in an active state, this will ensure that a four gate delay is the maximum delay a signal propagated through the micro-stepped delay chain 802 will be subject to, as a result of the OR gate 804. By way of example, if each capacitor were miscalibrated such that they added an extra 25 ps of delay instead of 15 ps, then selecting signal path 802d would result in a total added delay of 135 ps, which would exceed the propagation delay of 120 ps provided by two coarse delay units. With signal path 802e, however, the total added delay would be cut off at 120 ps.

Figure 9A:
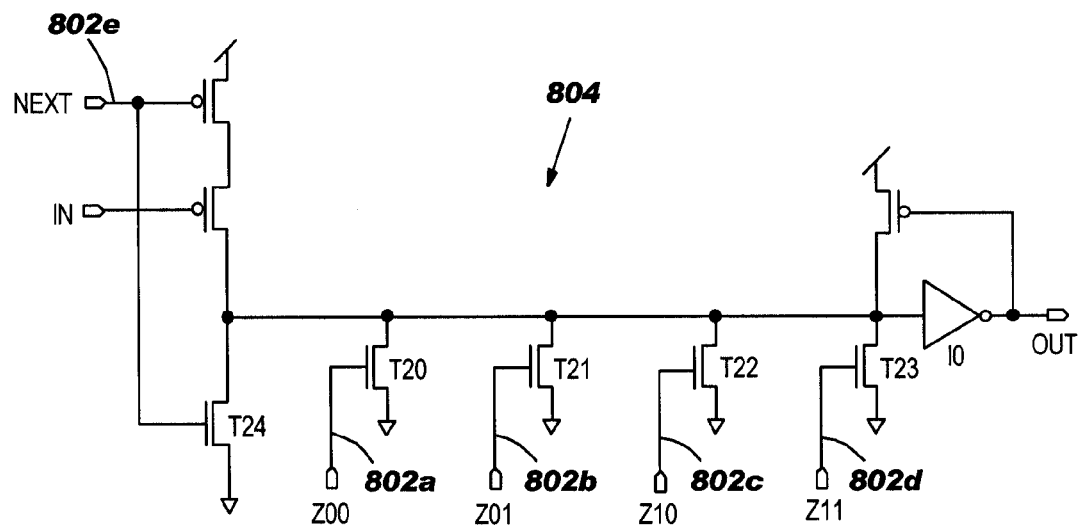
FIG. 9(a) is a schematic diagram illustrating one possible implementation of the OR gate shown in FIG. 8.
Figure 9B:
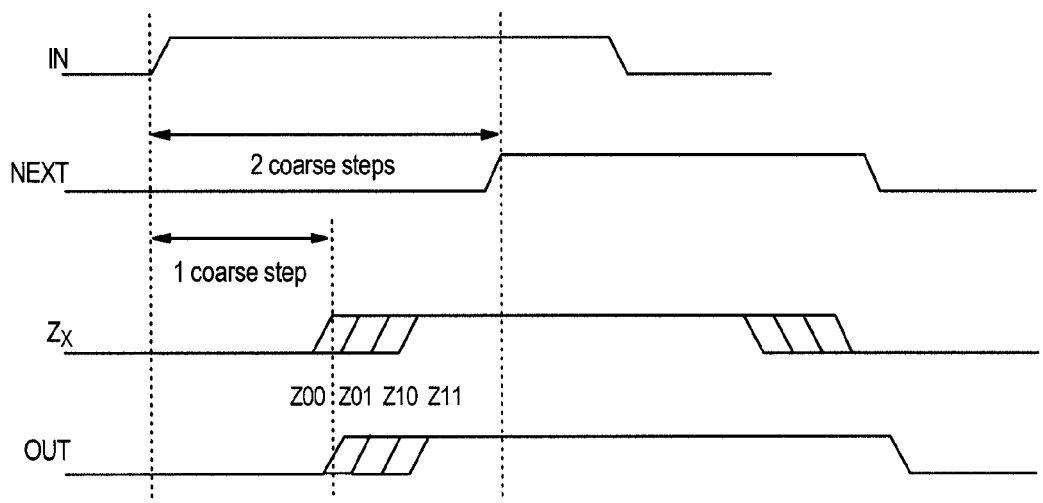
FIG. 9(b) is a signal timing diagram illustrating the relationship of signals propagating through the OR gate shown in FIGS. 8 and 9(a)

FIG. 9(a) is a schematic diagram illustrating one possible implementation of the OR gate 804 of FIG. 8. The five pull down devices T20, T21, T22, T23 and T24 have gate terminals that are coupled to the outputs of signal paths 802a through 802e, respectively, in FIG. 8. As particularly depicted in FIG. 9, terminals Z00, Z01, Z10 and Z11 are coupled to signal paths 802a through 802d, respectively. The terminal labeled NEXT in FIG. 9 is coupled to signal path 802e in FIG. 8. Again, the signal input to NEXT is the signal inputted to IN, delayed by 2 coarse delay units. A signal inputted to Z00 (if activated by the control logic) will be delayed by one coarse delay unit, while a signal inputted to Z01 (if activated by the control logic) will be delayed by one coarse delay unit, plus the delay associated by one unit of loaded capacitance (e.g., 1.25 coarse delay units).

Correspondingly, a signal inputted to Z10 (if activated by the control logic) will be delayed by one coarse delay unit, plus the delay associated by two units of load capacitance (e.g., 1.5 coarse delay units), while a signal inputted to Z11 (if activated by the control logic) will be delayed by one coarse delay unit, plus the delay associated by three units of loaded capacitance (e.g., 1.75 coarse delay units). A signal timing diagram illustrating the relationship of signals propagating through the OR gate 804 in FIG. 9(b). A small delay of the signal through output buffer IO is also noted.

Although the micro-stepped delay chain embodiment shown in FIGS. 8 and 9 illustrate four levels of micro-stepping, it will be appreciated that a greater or lesser number of increments may be used, depending on how fine the resolution of the loading capacitances may be adjusted. The end result of the micro-stepped delay chain 302 is finer control of the delay chain 300 and less observable jitter in the DLL delay. When this micro-stepped delay chain is inserted in series with a delay chain built of "coarse" delays, as shown in FIG. 1, there has effectively been more LSBs added to the granularity of the delay chain.

Figure 10:
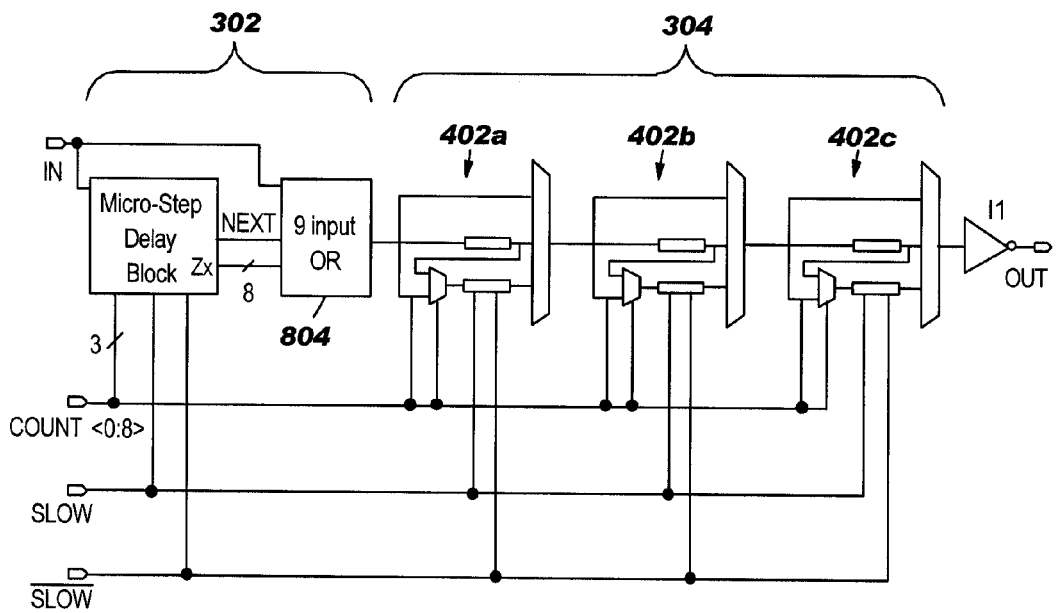
FIG. 10 is a schematic diagram of a 9-bit delay line implementation of the DLL delay chain, in accordance with a further embodiment of the invention.

FIG. 10 is a schematic diagram of a 9-bit delay line implementation of the DLL delay chain 300. Of the 9-bits included within the control signal COUNT<0:8>, 6 bits are used for the three stages 402a–c of the coarse delay chain 304 (2 bits per stage), and 3 bits are used for the micro-stepped delay chain 302. Thus, instead of four micro-stepping values as shown in FIG. 8, a three-bit control signal is used to adjust between eight micro-stepping values. As such, OR gate 804 receives 9 inputs thereto. Thus, the addition of three least significant bits to the 64 coarse steps results in an overall 512-step delay chain with steps. In the exemplary embodiment, at nominal conditions, the steps are configured at a granularity of about 12 ps. In addition, a "slow" mode is also provided for adjusting the granularity to 24 ps increments, depending upon the value of the control signal "SLOW" and its complement SLOW bar. For example, an implementation of the slow mode may be carried out by selectively defining a coarse step as including 4 NAND gates instead of 2.

Figure 11:
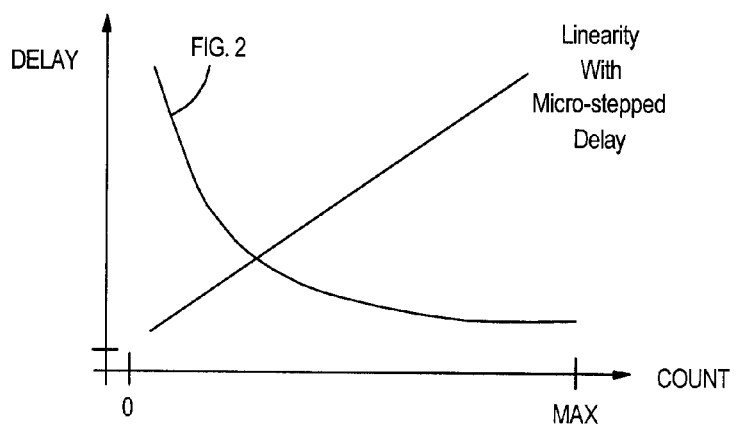
FIG. 11 is a graph that compares the linearity performance of the micro-stepped/coarse delay chain across the entire range thereof with respect to the conventional method shown in FIG. 2.

Finally, FIG. 11 is a graph that compares the linearity performance of the present micro-stepped/coarse delay chain across the entire range thereof with respect to the conventional method shown in FIG. 2. The fact that one curve monotonically increases, while the other decreases, is a mere detail which is taken into account during implementation. Not only is there a demonstrated linearity of delay versus COUNT level across the entire range of available steps, but the magnitude of the delay range itself compares favorably with existing approaches. Table I below illustrates the range of delays the 9-bit delay line embodiment of FIG. 10 is expected to achieve, as well as and the cycle times which the chip should be able to run without being DLL constrained.

TABLE I

| Range | Delay @ COUNT = 0 | Delay @ COUNT = MAX | Min Cycle | Max Cycle |
| --- | --- | --- | --- | --- |
| Normal | 0.54 nS | 6.79 nS | 2.35 nS | 8.5 nS |
| Slow | 0.63 nS | 12.41 nS | 2.43 nS | 14.2 nS |

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for implementing delay locked loop in an integrated circuit device, the method comprising:

configuring a coarse delay chain in series with a micro-stepped delay chain;

said coarse delay chain including a plurality of variable coarse delay units configured for selectively providing a coarse delay with respect to an input clock signal, and said micro-stepped delay chain configured for selectively providing a fine delay adjustment with respect to said input clock signal; and configuring a plurality of parallel signal paths within said micro-stepped delay chain, wherein one or more of said parallel signal paths are capacitively loaded so as to provide said fine delay adjustment.

2. The method of claim 1, wherein:

a first of said plurality of parallel signal paths comprises a single coarse delay unit;

a second of said plurality of parallel signal paths comprises a pair of coarse delay units; and the remainder of said plurality of parallel signal paths each comprising a single coarse delay unit having an intermediate node thereof loaded with a stepped value of capacitance with respect to one another;

wherein a signal propagated through any of said remainder of said plurality of parallel signal paths has a delay associated therewith that represents a stepped valued of delay between the delay provided by said single coarse delay unit and the delay provided by said pair of coarse delay units.

3. The method of claim 2, wherein said single coarse delay unit comprises a pair of serially connected NAND gates.

4. The method of claim 2, further comprising:
coupling an input signal to the micro-stepped delay chain to input terminals of each of said parallel signal paths; and
coupling an micro-stepping control signal to said single coarse delay unit and said capacitively loaded single coarse delay units;
wherein said micro-stepping control signal is further configured such that only one of said single coarse delay unit and said capacitively loaded single coarse delay units are enabled at a given time.

5. The method of claim 4, wherein said micro-stepped delay chain further comprises an OR gate, said OR gate having each of said plurality of parallel signal paths as inputs thereto.

6. The method of claim 5, wherein said pair of coarse delay units is biased in an enabled state such that a maximum delay of a signal propagated through said micro-stepped delay chain is the delay provided by said pair of coarse delay units.

7. The method of claim 3, wherein said pair of serially connected NAND gates comprise equalized NAND gates.

8. The method of claim 1, wherein said coarse delay chain further comprises:
a plurality of serially connected coarse delay stages, each of said plurality of coarse delay stages configured to selectively provide a discrete number of coarse delay values, wherein the delay value of said discrete number of coarse delay values is successively larger for each successive coarse delay stage.

9. The method of claim 8, wherein said coarse delay stages are configured such that discrete number of coarse delay values are implemented by routing an input signal through a specific number of said coarse delay units included within said coarse delay stages.

10. The method of claim 9, wherein said discrete number of coarse delay values are selected through a multiplexing device.

11. The method of claim 10, wherein at least a portion of said multiplexing device is configured from one of said coarse delay units.

12. The method of claim 9, wherein each of said coarse delay units comprises a pair of serially connected, NAND gates.

13. The method of claim 12, wherein said pair of serially connected NAND gates comprise equalized NAND gates.

14. A method for implementing a micro-stepped delay chain for use in a delay locked loop, the method comprising:
coupling a plurality of parallel signal paths to a common input;
a first of said plurality of parallel signal paths comprising a single coarse delay unit;
a second of said plurality of parallel signal paths comprising a pair of coarse delay units; and
the remainder of said plurality of parallel signal paths each comprising a single coarse delay unit having an intermediate node thereof loaded with a stepped value of capacitance with respect to one another;
wherein a signal propagated through any of said remainder of said plurality of parallel signal paths has a delay associated therewith that represents a stepped valued of delay between the delay provided by said single coarse delay unit and the delay provided by said pair of coarse delay units.

15. The method of claim 14, wherein each of said coarse delay units comprises a pair of serially connected NAND gates.

16. The method of claim 14, further comprising:
coupling a micro-stepping control signal to said single coarse delay unit and said capacitively loaded single coarse delay units;
wherein said micro-stepping control signal is further configured such that only one of said single coarse delay unit and said capacitively loaded single coarse delay units are enabled at a given time.

17. The method of claim 16, further comprising configuring an OR gate having each of said plurality of parallel signal paths as inputs thereto.

18. The method of claim 17, wherein said pair of coarse delay units is biased in an enabled state such that a maximum delay of a signal propagate through the micro-stepped delay chain is the delay provided by said pair of coarse delay units.

19. The method of claim 17, wherein said pair of coarse delay units is biased in an enabled state such that a maximum delay of a signal propagated through the micro-stepped delay chain is the delay provided by said pair of coarse delay units.

* * * * *